(12) United States Patent
Zhao

(10) Patent No.: US 10,714,511 B2
(45) Date of Patent: Jul. 14, 2020

(54) PULL-DOWN CIRCUIT OF GATE DRIVING UNIT AND DISPLAY DEVICE

(71) Applicant: WUHAN CHINA STAR OPTOELECTRONICS TECHNOLOGY CO., LTD., Wuhan, Hubei (CN)

(72) Inventor: Mang Zhao, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/336,738

(22) PCT Filed: Sep. 12, 2018

(86) PCT No.: PCT/CN2018/105189
§ 371 (c)(1),
(2) Date: Mar. 26, 2019

(87) PCT Pub. No.: WO2020/042222
PCT Pub. Date: Mar. 5, 2020

(65) Prior Publication Data
US 2020/0075638 A1 Mar. 5, 2020

(30) Foreign Application Priority Data
Aug. 28, 2018 (CN) .......................... 2018 1 0989138

(51) Int. Cl.
G06F 3/041 (2006.01)
H01L 27/12 (2006.01)
G09G 3/20 (2006.01)

(52) U.S. Cl.
CPC ........ *H01L 27/1244* (2013.01); *G06F 3/0412* (2013.01); *G09G 3/20* (2013.01);
(Continued)

(58) Field of Classification Search
None
See application file for complete search history.

(56) References Cited

U.S. PATENT DOCUMENTS 10,302,985 B1 * 5/2019 Gong .................. G02F 1/13338
2004/0189585 A1 9/2004 Moon
(Continued)

FOREIGN PATENT DOCUMENTS

CN 102005172 A 4/2011
CN 104332181 A 2/2015
(Continued)

*Primary Examiner* — Adam R. Giesy
(74) *Attorney, Agent, or Firm* — Muncy, Geissler, Olds & Lowe, P.C.

(57) ABSTRACT

A pull-down circuit of a gate driving unit includes: a first thin film transistor having a first gate to which a scan direction signal is inputted, a first source and a first drain to which a clock signal is inputted; a second thin film transistor having a second gate coupled to the first source, a second source coupled to a pull-down control node and a second drain to which a first direct-current voltage is inputted; a third thin film transistor having a third gate to which a first control signal is inputted, a third source coupled to the pull-down control node and a third drain coupled to a second direct-current voltage; and a fourth thin film transistor having a fourth gate coupled to the pull-down control node, a fourth source coupled to an output node and a fourth drain coupled to the second direct-current voltage.

15 Claims, 3 Drawing Sheets

(52) U.S. Cl.
 CPC ............ *G09G 2300/0408* (2013.01); *G09G 2310/0283* (2013.01); *G09G 2330/023* (2013.01); *G09G 2330/026* (2013.01); *G09G 2354/00* (2013.01)

(56) References Cited

U.S. PATENT DOCUMENTS

| | | |
|---|---|---|
| 2016/0125954 A1 | 5/2016 | Gu |
| 2018/0047751 A1 | 2/2018 | Xiao et al. |
| 2018/0350315 A1 | 12/2018 | Zhang et al. |
| 2019/0385556 A1* | 12/2019 | Guan .................. G09G 3/3648 |

FOREIGN PATENT DOCUMENTS

| | | |
|---|---|---|
| CN | 105096904 A | 11/2015 |
| CN | 105469766 A | 4/2016 |
| CN | 208737869 U | 4/2019 |
| TW | 200502908 A | 1/2005 |

* cited by examiner

PULL-DOWN CIRCUIT OF GATE DRIVING UNIT AND DISPLAY DEVICE

BACKGROUND

Field

The present disclosure relates to a display device, and more particularly to a pull-down circuit of a gate driving unit and a display device.

Background

Gate driver on array (GOA) technologies mean that gate driving circuits are manufactured on array substrate by a conventional array manufacturing process of thin film transistor liquid crystal displays (TFT-LCD) for implementing a driving manner of scanning gate lines row by row.

A low power wake-up gesture (LPWG) mode is a special function of smart phones. That is, sliding operations on screens are supported when the smart phones is in a standby (black screen) mode. Users can directly wake up some functions or corresponding software by preset gestures. In the LPWG mode, backlight sources of the smart phones are in a turned-off state, and all pixels store a common voltage (VCOM).

In the LPWG mode, gate lines are driven in two stages. In a first stage, scan signals are not provided for the gate lines, and screens of the smart phones can be configured to sense touch signals. In a second stage, the screens of the smart phones can be configured to display images. The first stage and the second stage are operated alternately.

However, when the first stage is switched to the second stage, micro-short circuit phenomenon occurs in elements of pull-down circuits of GOA modules due to influence of the above sensing signals. As such, power consumption of the screens is high in the LPWG mode.

Consequently, there is a need to solve the above-mentioned problems in the prior art.

SUMMARY OF THE DISCLOSURE

The micro-short circuit phenomenon occurs in the elements of the pull-down circuits of the GOA modules due to the influence of the above sensing signals. As such, the power consumption of the screens is high in the LPWG mode.

To solve the above problems, a pull-down circuit of a gate driving unit provided by the present disclosure is utilized for a display device and includes: a first thin film transistor having a first gate, a first source and a first drain, a scan direction signal inputted to the first gate, and a clock signal inputted to the first drain; a second thin film transistor having a second gate, a second source and a second drain, the second gate electrically coupled to the first source, the second source electrically coupled to a pull-down control node, and a first direct-current voltage inputted to the second drain; a third thin film transistor having a third gate, a third source and a third drain, a first control signal inputted to the third gate, the third source electrically coupled to the pull-down control node, and the third drain electrically coupled to a second direct-current voltage; and a fourth thin film transistor having a fourth gate, a fourth source and a fourth drain, the fourth gate electrically coupled to the pull-down control node, the fourth source electrically coupled to an output node, and the fourth drain electrically coupled to the second direct-current voltage, wherein the first thin film transistor, the second thin film transistor, the third thin film transistor, and the fourth thin film transistor are N-channel metal-oxide-semiconductor field-effect transistors.

In one embodiment, the pull-down circuit of the gate driving unit further includes: a fifth thin film transistor having a fifth gate, a fifth source and a fifth drain, the first control signal inputted to the fifth gate and the fifth drain, and the fifth source electrically coupled to the output node.

In one embodiment, the pull-down circuit of the gate driving unit further includes: a sixth thin film transistor having a sixth gate, a sixth source and a sixth drain, a second control signal inputted to the sixth gate, the sixth source electrically coupled to the second direct-current voltage, and the sixth drain electrically coupled to the output node.

In one embodiment, in a first stage, the display device is configured to sense at least one touch signal. In a second stage, the display device is configured to display an image.

In one embodiment, after the first stage ends and before the second stage starts, the scan direction signal is converted up to a second voltage level from a first voltage level for a predetermined time duration and then converted back to the first voltage level.

To solve the above problems, a pull-down circuit of a gate driving unit provided by the present disclosure is utilized for a display device and includes: a first thin film transistor having a first gate, a first source and a first drain, a scan direction signal inputted to the first gate, and a clock signal inputted to the first drain; a second thin film transistor having a second gate, a second source and a second drain, the second gate electrically coupled to the first source, the second source electrically coupled to a pull-down control node, and a first direct-current voltage inputted to the second drain; a third thin film transistor having a third gate, a third source and a third drain, a first control signal inputted to the third gate, the third source electrically coupled to the pull-down control node, and the third drain electrically coupled to a second direct-current voltage; and a fourth thin film transistor having a fourth gate, a fourth source and a fourth drain, the fourth gate electrically coupled to the pull-down control node, the fourth source electrically coupled to an output node, and the fourth drain electrically coupled to the second direct-current voltage.

In one embodiment, the pull-down circuit of the gate driving unit further includes: a fifth thin film transistor having a fifth gate, a fifth source and a fifth drain, the first control signal inputted to the fifth gate and the fifth drain, and the fifth source electrically coupled to the output node.

In one embodiment, the pull-down circuit of the gate driving unit further includes: a sixth thin film transistor having a sixth gate, a sixth source and a sixth drain, a second control signal inputted to the sixth gate, the sixth source electrically coupled to the second direct-current voltage, and the sixth drain electrically coupled to the output node.

In one embodiment, in a first stage, the display device is configured to sense at least one touch signal. In a second stage, the display device is configured to display an image.

In one embodiment, after the first stage ends and before the second stage starts, the scan direction signal is converted up to a second voltage level from a first voltage level for a predetermined time duration and then converted back to the first voltage level.

To solve the above problems, a display device provided by the present disclosure has a display area and a non-display area. The display device includes: a plurality of source lines and a plurality of gate lines disposed on the display area; at least one source driving unit disposed on the non-display area and configured to provide data signals for the source lines; and at least one gate driving unit disposed on the non-display area and configured to provide scan signals for the gate lines. The gate driving unit at least includes a pull-down circuit. The pull-down circuit includes: a first thin film transistor having a first gate, a first source and a first drain, a scan direction signal inputted to the first gate, and a clock signal inputted to the first drain; a second thin film transistor having a second gate, a second source and a second drain, the second gate electrically coupled to the first source, the second source electrically coupled to a pull-down control node, and a first direct-current voltage inputted to the second drain; a third thin film transistor having a third gate, a third source and a third drain, a first control signal inputted to the third gate, the third source electrically coupled to the pull-down control node, and the third drain electrically coupled to a second direct-current voltage; and a fourth thin film transistor having a fourth gate, a fourth source and a fourth drain, the fourth gate electrically coupled to the pull-down control node, the fourth source electrically coupled to an output node, and the fourth drain electrically coupled to the second direct-current voltage.

In one embodiment, the display device further includes: a fifth thin film transistor having a fifth gate, a fifth source and a fifth drain, the first control signal inputted to the fifth gate and the fifth drain, and the fifth source electrically coupled to the output node.

In one embodiment, the display device further includes: a sixth thin film transistor having a sixth gate, a sixth source and a sixth drain, a second control signal inputted to the sixth gate, the sixth source electrically coupled to the second direct-current voltage, and the sixth drain electrically coupled to the output node.

In one embodiment, in a first stage, the display device is configured to sense at least one touch signal. In a second stage, the display device is configured to display an image.

In one embodiment, after the first stage ends and before the second stage starts, the scan direction signal is converted up to a second voltage level from a first voltage level for a predetermined time duration and then converted back to the first voltage level.

Compared to the prior art, in the pull-down circuit and the display device of the present disclosure, the power consumption in the LPWG mode can be reduced by converting the scan direction signal to the second voltage level from the first voltage level for a predetermined time duration and then converting the second voltage level back to the first voltage level.

DETAILED DESCRIPTION OF THE PREFERRED EMBODIMENTS

Hereinafter, exemplary embodiments of the present disclosure will be described with reference to the accompanying drawings for illustrating specific embodiments which can be carried out by the present disclosure.

Figure 1:
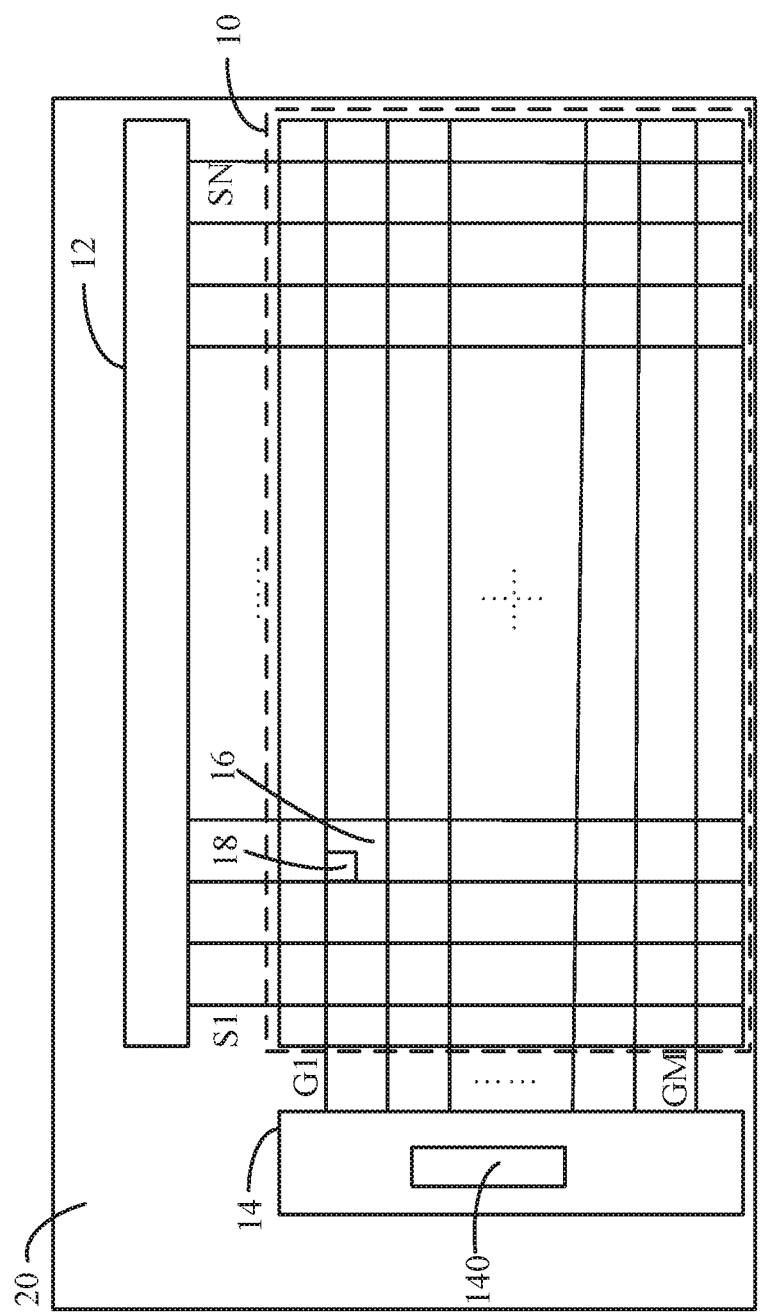
FIG. 1 illustrates a display device in accordance with an embodiment of the present disclosure.

Please refer to FIG. 1. FIG. 1 illustrates a display device in accordance with an embodiment of the present disclosure.

The display device has a display area 10 and a non-display area 12. The display device includes a plurality of source lines S1-SN, a plurality of gate lines G1-Gm, at least one source driving unit 12 (one source driving unit 12 is shown in FIG. 1) and at least one gate driving unit 14 (one gate driving unit 14 is shown in FIG. 1).

The source lines S1-SN and the gate lines G1-GM are disposed on the display area 10. In detail, the source lines S1-SN are disposed on the display area 10 and extend to the source driving unit 12. The gate lines G1-GM are disposed on the display area 10 and extend to the gate driving unit 14. The source lines S1-SN are formed in a first direction. The gate lines G1-GM are formed in a second direction. The first direction is perpendicular to the second direction. The source lines S1-SN and the gate lines G1-GM define a plurality of pixels 16. Each of the pixels is electrically coupled to a thin film transistor 18.

The source driving unit 12 is disposed on the non-display area 20. The source driving unit 12 is electrically coupled to the source lines S1-SN and configured to provide data signals for the source lines S1-SN. The data signals are configured to be written into the pixels 16.

The gate driving unit 14 is disposed on the non-display area 20. That is, the gate driving unit 14 is a GOA circuit. The gate driving unit 14 is electrically coupled to the gate lines G1-Gm and configured to provide scan signals for the gate lines G1-Gm. The gate driving unit 14 at least includes a pull-down circuit 140.

Figure 2:
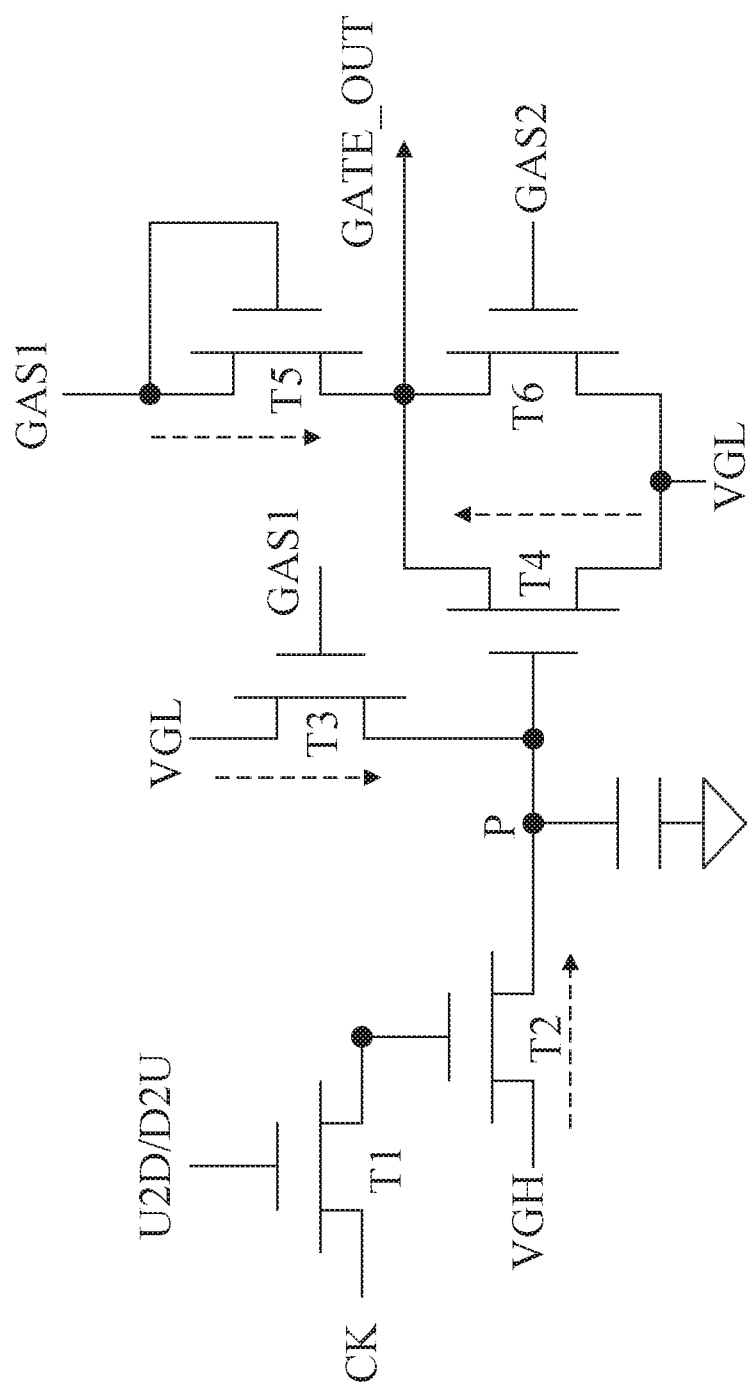
FIG. 2 illustrates a circuit diagram of a pull-down circuit in accordance with an embodiment of the present disclosure.

Please refer to FIG. 1 and FIG. 2. FIG. 2 illustrates a circuit diagram of the pull-down circuit 140 in accordance with an embodiment of the present disclosure.

The pull-down circuit 140 includes a first thin film transistor T1, a second thin film transistor T2, a third thin film transistor T3, a fourth thin film transistor T4, a fifth thin film transistor T5 and a sixth thin film transistor T6.

The first thin film transistor T1 has a first gate, a first source and a first drain. A scan direction signal U2D/D2U is inputted to the first gate. A clock signal is inputted to the first drain.

The second thin film transistor T2 has a second gate, a second source and a second drain. The second gate is electrically coupled to the first source. The second source is electrically coupled to a pull-down control node P. A first direct-current voltage VGH is inputted to the second drain.

The third thin film transistor T3 has a third gate, a third source and a third drain. A first control signal GAS1 is inputted to the third gate. The third source is electrically coupled to the pull-down control node P. The third drain is electrically coupled to a second direct-current voltage VGL.

The fourth thin film transistor T4 has a fourth gate, a fourth source and a fourth drain. The fourth gate is electrically coupled to the pull-down control node P. The fourth source is electrically coupled to an output node GATE_OUT. The fourth drain is electrically coupled to the second direct-current voltage VGL.

The fifth thin film transistor T5 has a fifth gate, a fifth source and a fifth drain. The first control signal GAS1 is inputted to the fifth gate and the fifth drain. The fifth source is electrically coupled to the output node GATE_OUT.

The sixth thin film transistor T6 has a sixth gate, a sixth source and a sixth drain. A second control signal GAS2 is inputted to the sixth gate. The sixth source is electrically coupled to the second direct-current voltage VGL. The sixth drain is electrically coupled to the output node GATE_OUT.

In the present embodiment, the first thin film transistor T1, the second thin film transistor T2, the third thin film transistor T3, the fourth thin film transistor T4, the fifth thin film transistor T5 and the sixth thin film transistor T6 may be N-channel metal-oxide-semiconductor field-effect transistors (N-MOSFETs).

Figure 3:
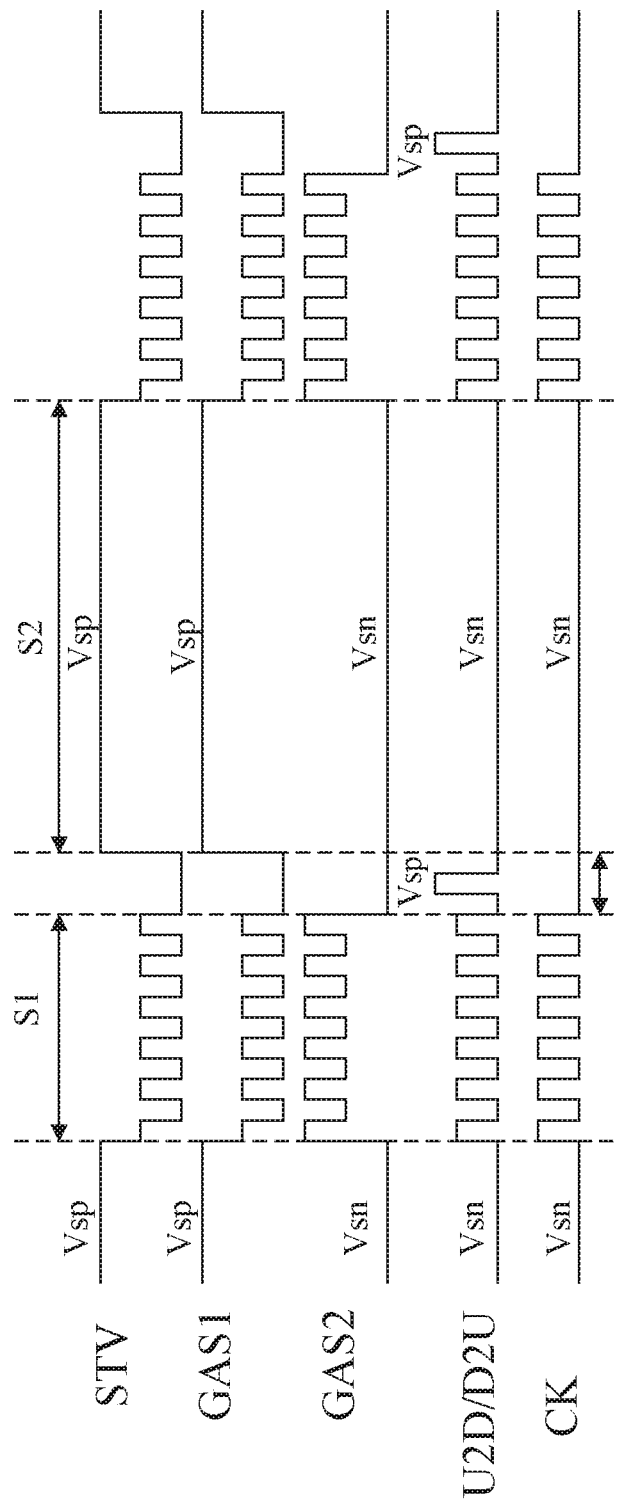
FIG. 3 illustrates driving waves of the pull-down circuit in a low power wake-up gesture (LPWG) mode in accordance with an embodiment of the present disclosure.

Please refer to FIG. 1 to FIG. 3. FIG. 3 illustrates driving waves of the pull-down circuit 140 in a low power wake-up gesture (LPWG) mode in accordance with an embodiment of the present disclosure.

In the LPWG mode, the gate lines G1-GM are driven in two stages. In a first stage S1, scan signals are not provided for the gate lines G1-GM (all gates lines are off), and the display device can be configured to sense at least one touch signal. In a second stage S2, the scan signals are sequentially provided for the gate lines G1-GM (all gates lines are on), and the display device can be configured to display an image. The first stage and the second stage are operated alternately.

When the second stage S2 is entered after the first stage S1 ends, a competition relationship is formed by the second thin film transistor T2 and the third thin film transistor T3 because a touch pulse signal is high in the first stage S1. That is, a micro-short circuit path occurs between Vsp and Vsn. The first control signal GAS1 does not have enough ability of pulling down a voltage of the pull-down control node P via the third thin film transistor T3. Accordingly, the pull-down control node P turns on the fourth thin film transistor T4. That is, a competition relationship is formed by the fourth thin film transistor T4 and the fifth thin film transistor T5. A micro-short circuit path occurs between the first control signal GAS1 (Vsp) and the second direct-current voltage VGL (Vsn).

As such, the power consumption is high due to the above competition relationships.

In the display device of the present disclosure, as shown in FIG. 3, after the first stage ends and before the second stage starts, the scan direction signal U2D/D2U is pulled up to the high voltage level Vsp from the low voltage level Vsn for a predetermined time duration and then pulled down back to the low voltage level Vsn. The predetermined time duration may be acquired according to characteristics of the display device (e.g., a frame rate). The scan direction signal U2D/D2U having the high voltage level Vsp clears the second gate of the second thin film transistor T2 (i.e., pulls down to the low voltage level Vsn), so that the second gate of the second thin film transistor T2 is turned off. As such, the competition path is not formed by the second thin film transistor T2 and the third thin film transistor T3. The first control signal GAS1 turns on the third thin film transistor T3. The pull-down control node P is pulled down to the low voltage level Vsn, and thus the fourth thin film transistor T4 is turned off. As such, the competition path is not formed by the fourth thin film transistor T4 and the fifth thin film transistor T5. The output node GATE_OUT can output the high voltage level Vsp.

In another embodiment, the scan direction signal U2D/D2U may be converted to the low voltage level Vsn from the high voltage level Vsp for a predetermined time duration and then converted back to the high voltage level Vsp. That is, in the present disclosure, the scan direction signal U2D/D2U may be converted up to a second voltage level from a first voltage level for a predetermined time duration and then converted back to the first voltage level. When the first voltage level is the low voltage level Vsn, the second voltage level is the high voltage level Vsp. When the first voltage level is the high voltage level Vsp, the second voltage level is the low voltage level Vsn.

In the pull-down circuit and the display device of the present disclosure, the power consumption in the LPWG mode can be reduced by converting the scan direction signal to the second voltage level from the first voltage level for a predetermined time duration and then converting the second voltage level back to the first voltage level.

In summary, although the present disclosure has been provided in the preferred embodiments described above, the foregoing preferred embodiments are not intended to limit the present disclosure. Those skilled in the art, without departing from the spirit and scope of the present disclosure, may make modifications and variations, so the scope of the protection of the present disclosure is defined by the claims.

What is claimed is:

1. A pull-down circuit of a gate driving unit, utilized for a display device, the pull-down circuit of the gate driving unit comprising:
   a first thin film transistor having a first gate, a first source and a first drain, a scan direction signal inputted to the first gate, and a clock signal inputted to the first drain;
   a second thin film transistor having a second gate, a second source and a second drain, the second gate electrically coupled to the first source, the second source electrically coupled to a pull-down control node, and a first direct-current voltage inputted to the second drain;
   a third thin film transistor having a third gate, a third source and a third drain, a first control signal inputted to the third gate, the third source electrically coupled to the pull-down control node, and the third drain electrically coupled to a second direct-current voltage; and
   a fourth thin film transistor having a fourth gate, a fourth source and a fourth drain, the fourth gate electrically coupled to the pull-down control node, the fourth source electrically coupled to an output node, and the fourth drain electrically coupled to the second direct-current voltage,
   wherein the first thin film transistor, the second thin film transistor, the third thin film transistor, and the fourth thin film transistor are N-channel metal-oxide-semiconductor field-effect transistors.

2. The pull-down circuit of the gate driving unit of claim 1, further comprising:
   a fifth thin film transistor having a fifth gate, a fifth source and a fifth drain, the first control signal inputted to the fifth gate and the fifth drain, and the fifth source electrically coupled to the output node.

3. The pull-down circuit of the gate driving unit of claim 2, further comprising:
   a sixth thin film transistor having a sixth gate, a sixth source and a sixth drain, a second control signal inputted to the sixth gate, the sixth source electrically coupled to the second direct-current voltage, and the sixth drain electrically coupled to the output node.

4. The pull-down circuit of the gate driving unit of claim 1, wherein in a first stage, the display device is configured to sense at least one touch signal,
   in a second stage, the display device is configured to display an image.

5. The pull-down circuit of the gate driving unit of claim 4, wherein after the first stage ends and before the second stage starts, the scan direction signal is converted up to a second voltage level from a first voltage level for a predetermined time duration and then converted back to the first voltage level.

6. A pull-down circuit of a gate driving unit, utilized for a display device, the pull-down circuit of the gate driving unit comprising:

a first thin film transistor having a first gate, a first source and a first drain, a scan direction signal inputted to the first gate, and a clock signal inputted to the first drain;

a second thin film transistor having a second gate, a second source and a second drain, the second gate electrically coupled to the first source, the second source electrically coupled to a pull-down control node, and a first direct-current voltage inputted to the second drain;

a third thin film transistor having a third gate, a third source and a third drain, a first control signal inputted to the third gate, the third source electrically coupled to the pull-down control node, and the third drain electrically coupled to a second direct-current voltage; and a fourth thin film transistor having a fourth gate, a fourth source and a fourth drain, the fourth gate electrically coupled to the pull-down control node, the fourth source electrically coupled to an output node, and the fourth drain electrically coupled to the second direct-current voltage.

7. The pull-down circuit of the gate driving unit of claim 6, further comprising:

a fifth thin film transistor having a fifth gate, a fifth source and a fifth drain, the first control signal inputted to the fifth gate and the fifth drain, and the fifth source electrically coupled to the output node.

8. The pull-down circuit of the gate driving unit of claim 7, further comprising:

a sixth thin film transistor having a sixth gate, a sixth source and a sixth drain, a second control signal inputted to the sixth gate, the sixth source electrically coupled to the second direct-current voltage, and the sixth drain electrically coupled to the output node.

9. The pull-down circuit of the gate driving unit of claim 6, wherein in a first stage, the display device is configured to sense at least one touch signal, in a second stage, the display device is configured to display an image.

10. The pull-down circuit of the gate driving unit of claim 9, wherein after the first stage ends and before the second stage starts, the scan direction signal is converted up to a second voltage level from a first voltage level for a predetermined time duration and then converted back to the first voltage level.

11. A display device having a display area and a non-display area, the display device comprising:

a plurality of source lines and a plurality of gate lines disposed on the display area;

at least one source driving unit disposed on the non-display area and configured to provide data signals for the source lines; and at least one gate driving unit disposed on the non-display area and configured to provide scan signals for the gate lines, wherein the gate driving unit at least comprises a pull-down circuit, and the pull-down circuit comprises:

a first thin film transistor having a first gate, a first source and a first drain, a scan direction signal inputted to the first gate, and a clock signal inputted to the first drain;

a second thin film transistor having a second gate, a second source and a second drain, the second gate electrically coupled to the first source, the second source electrically coupled to a pull-down control node, and a first direct-current voltage inputted to the second drain;

a third thin film transistor having a third gate, a third source and a third drain, a first control signal inputted to the third gate, the third source electrically coupled to the pull-down control node, and the third drain electrically coupled to a second direct-current voltage; and a fourth thin film transistor having a fourth gate, a fourth source and a fourth drain, the fourth gate electrically coupled to the pull-down control node, the fourth source electrically coupled to an output node, and the fourth drain electrically coupled to the second direct-current voltage.

12. The display device of claim 11, further comprising:

a fifth thin film transistor having a fifth gate, a fifth source and a fifth drain, the first control signal inputted to the fifth gate and the fifth drain, and the fifth source electrically coupled to the output node.

13. The display device of claim 12, further comprising:

a sixth thin film transistor having a sixth gate, a sixth source and a sixth drain, a second control signal inputted to the sixth gate, the sixth source electrically coupled to the second direct-current voltage, and the sixth drain electrically coupled to the output node.

14. The display device of claim 11, wherein in a first stage, the display device is configured to sense at least one touch signal, in a second stage, the display device is configured to display an image.

15. The display device of claim 14, wherein after the first stage ends and before the second stage starts, the scan direction signal is converted up to a second voltage level from a first voltage level for a predetermined time duration and then converted back to the first voltage level.

* * * * *